(12) United States Patent
Yang et al.

(10) Patent No.: US 12,289,899 B2
(45) Date of Patent: Apr. 29, 2025

(54) NITRIDE-BASED SEMICONDUCTOR DEVICE AND METHOD FOR MANUFACTURING THE SAME

(71) Applicant: INNOSCIENCE (SUZHOU) TECHNOLOGY CO., LTD., Suzhou (CN)

(72) Inventors: Chao Yang, Suzhou (CN); Chunhua Zhou, Suzhou (CN); Yong Liu, Suzhou (CN); Qiyue Zhao, Suzhou (CN); Jingyu Shen, Suzhou (CN)

(73) Assignee: INNOSCIENCE (SUZHOU) TECHNOLOGY CO., LTD., Suzhou (CN)

( * ) Notice: Subject to any disclaimer, the term of this patent is extended or adjusted under 35 U.S.C. 154(b) by 7 days.

(21) Appl. No.: 17/767,062

(22) PCT Filed: Dec. 17, 2021

(86) PCT No.: PCT/CN2021/139017
§ 371 (c)(1),
(2) Date: Apr. 7, 2022

(87) PCT Pub. No.: WO2023/108591
PCT Pub. Date: Jun. 22, 2023

(65) Prior Publication Data
US 2024/0105812 A1    Mar. 28, 2024

(51) Int. Cl.
*H10D 30/01* (2025.01)
*H10D 30/47* (2025.01)
(Continued)

(52) U.S. Cl.
CPC ......... *H10D 30/015* (2025.01); *H10D 30/475* (2025.01); *H10D 30/477* (2025.01); *H10D 62/8503* (2025.01); *H10D 64/513* (2025.01)

(58) Field of Classification Search
None
See application file for complete search history.

(56) References Cited

U.S. PATENT DOCUMENTS

2006/0219997 A1* 10/2006 Kawasaki ............. H10D 62/82
257/E29.05
2009/0072269 A1*  3/2009 Suh ....................... H10D 84/82
257/136
(Continued)

FOREIGN PATENT DOCUMENTS

CN         102017160 A      4/2011
CN         105047707 A     11/2015
(Continued)

OTHER PUBLICATIONS

Machine translation of CN105845724 (A) (Year: 2016).*
International Search Report and Written Opinion of corresponding PCT application No. PCT/CN2021/139017 mailed on Aug. 25, 2022.

*Primary Examiner* — Bilkis Jahan
(74) *Attorney, Agent, or Firm* — Li & Cai Intellectual Property (USA) Office

(57) ABSTRACT

A nitride-based semiconductor device includes a first nitride-based semiconductor layer, a second nitride-based semiconductor layer, a third nitride-based semiconductor layer, a passivation layer, a gate insulator layer, and a gate electrode. The first nitride-based semiconductor layer includes at least two doped barrier regions defining an aperture between the doped barrier regions. The second nitride-based semiconductor layer is disposed over first nitride-based semiconductor layer. The third nitride-based semiconductor layer is disposed on the second nitride-based semiconductor layer and has a bandgap higher than a bandgap of the second nitride-based semiconductor layer. The passivation layer is disposed over the third nitride-based (Continued)

semiconductor layer, in which a vertical projection of the passivation layer on the first nitride-based semiconductor layer is spaced apart from the aperture. The gate insulator layer is disposed over the third nitride-based semiconductor layer. The gate electrode is disposed over the gate insulator layer and aligns with the aperture.

20 Claims, 5 Drawing Sheets

(51) Int. Cl.
    *H10D 62/85*     (2025.01)
    *H10D 64/27*     (2025.01)

(56) References Cited

U.S. PATENT DOCUMENTS

| | | | | |
|---|---|---|---|---|
| 2009/0116526 A1* | 5/2009 | Hashimoto | ......... | H01S 5/18369 |
| | | | | 438/46 |
| 2009/0146185 A1* | 6/2009 | Suh | ...................... | H10D 30/472 |
| | | | | 257/E27.061 |
| 2009/0267078 A1* | 10/2009 | Mishra | ................ | H01L 29/2003 |
| | | | | 257/E21.403 |
| 2013/0153963 A1 | 6/2013 | Shealy et al. | | |
| 2014/0252370 A1 | 9/2014 | Kwak et al. | | |
| 2017/0194531 A1* | 7/2017 | Huang | ................. | H10H 20/833 |
| 2017/0229569 A1* | 8/2017 | Chowdhury | ....... | H10D 30/4755 |
| 2018/0151681 A1 | 5/2018 | Lavanga et al. | | |
| 2019/0288101 A1 | 9/2019 | Longobardi et al. | | |

FOREIGN PATENT DOCUMENTS

| | | | | |
|---|---|---|---|---|
| CN | 105845724 A | * | 8/2016 | ......... H01L 29/4236 |
| CN | 111883589 A | | 11/2020 | |
| CN | 112289858 A | | 1/2021 | |
| CN | 112447836 A | | 3/2021 | |
| WO | 2020055984 A1 | | 3/2020 | |

* cited by examiner

NITRIDE-BASED SEMICONDUCTOR DEVICE AND METHOD FOR MANUFACTURING THE SAME

FIELD OF THE DISCLOSURE

The present disclosure generally relates to a nitride-based semiconductor device. More specifically, the present disclosure relates to a nitride-based semiconductor device has a vertical HEMT structure with a thin barrier layer to achieve a normally-off state.

BACKGROUND OF THE DISCLOSURE

In recent years, intense research on high-electron-mobility transistors (HEMTs) has been prevalent, particularly for high power switching and high frequency applications. III-nitride-based HEMTs utilize a heterojunction interface between two materials with different bandgaps to form a quantum well-like structure, which accommodates a two-dimensional electron gas (2DEG) region, satisfying demands of high power/frequency devices. In addition to HEMTs, examples of devices having heterostructures further include heterojunction bipolar transistors (HBT), heterojunction field effect transistor (HFET), and modulation-doped FETs (MODFET).

SUMMARY OF THE DISCLOSURE

In accordance with one aspect of the present disclosure, a nitride-based semiconductor device is provided. The nitride-based semiconductor device includes a first nitride-based semiconductor layer, a second nitride-based semiconductor layer, a third nitride-based semiconductor layer, a passivation layer, a gate insulator layer, and a gate electrode. The first nitride-based semiconductor layer includes at least two doped barrier regions defining an aperture between the doped barrier regions. The second nitride-based semiconductor layer is disposed over first nitride-based semiconductor layer. The third nitride-based semiconductor layer is disposed on the second nitride-based semiconductor layer and has a bandgap higher than a bandgap of the second nitride-based semiconductor layer. The passivation layer is disposed over the third nitride-based semiconductor layer, in which a vertical projection of the passivation layer on the first nitride-based semiconductor layer is spaced apart from the aperture. The gate insulator layer is disposed over the third nitride-based semiconductor layer. The gate electrode is disposed over the gate insulator layer and aligns with the aperture.

In accordance with one aspect of the present disclosure, a method for manufacturing a semiconductor device is provided. The method includes steps as follows. A second nitride-based semiconductor layer is formed over a first nitride-based semiconductor layer. A third nitride-based semiconductor layer is formed over a second nitride-based semiconductor layer to form a heterojunction therebetween. A passivation layer is formed on the third nitride-based semiconductor layer. The passivation layer is patterned to expose a portion of the third nitride-based semiconductor layer which aligns with an aperture of the first nitride-based semiconductor layer. A gate insulator layer is formed on the exposed portion of the third nitride-based semiconductor layer. A gate electrode is formed on the gate insulator layer.

In accordance with one aspect of the present disclosure, a nitride-based semiconductor device is provided. The nitride-based semiconductor device includes a first nitride-based semiconductor layer, a second nitride-based semiconductor layer, a third nitride-based semiconductor layer, a passivation layer, a gate insulator layer, and a gate electrode. The first nitride-based semiconductor layer includes at least two doped barrier regions defining an aperture between the doped barrier regions. The second nitride-based semiconductor layer is disposed over first nitride-based semiconductor layer. The third nitride-based semiconductor layer is disposed on the second nitride-based semiconductor layer and has a bandgap higher than a bandgap of the second nitride-based semiconductor layer. The passivation layer is disposed over the third nitride-based semiconductor layer to form a trench with the third nitride-based semiconductor layer, in which the trench aligns with the aperture. The gate insulator layer is disposed over the third nitride-based semiconductor layer and within the trench. The gate electrode is disposed over the gate insulator layer and within the trench.

With such configuration, a semiconductor device can have a vertical structure with a normally-off state. The normally-off state can be achieved by a manner free from a recessing process, so it can avoid an etching process performed on a barrier layer and a channel layer.

BRIEF DESCRIPTION OF THE DRAWINGS

Aspects of the present disclosure are readily understood from the following detailed description when read with the accompanying figures. It should be noted that various features may not be drawn to scale. That is, the dimensions of the various features may be arbitrarily increased or reduced for clarity of discussion. Embodiments of the present disclosure are described in more detail hereinafter with reference to the drawings, in which.

DETAILED DESCRIPTION

Figure 1A:
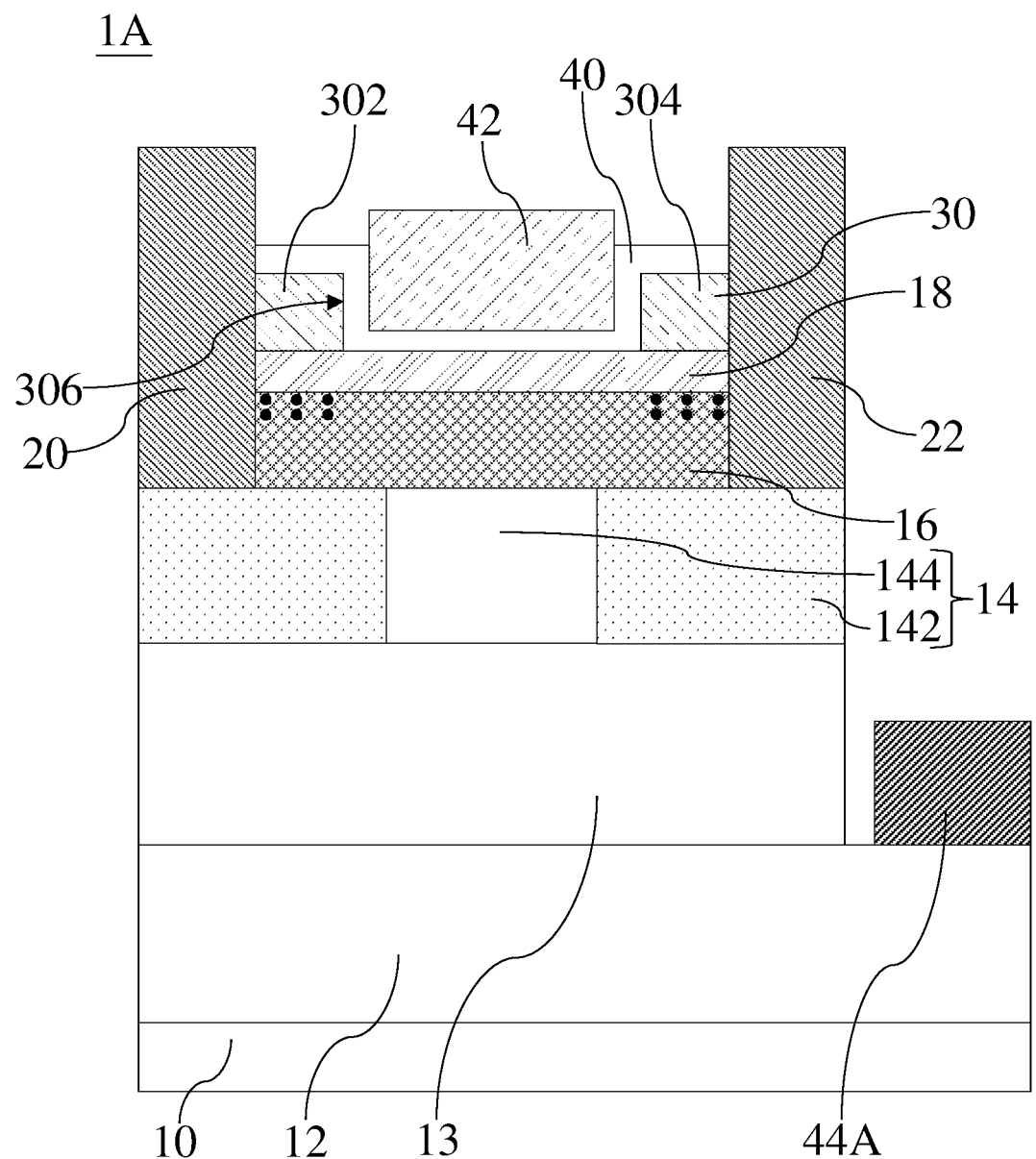
FIG. 1A is a vertical cross-sectional view of a semiconductor device according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "on," "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Further, it is noted that the actual shapes of the various structures depicted as approximately rectangular may, in actual device, be curved, have rounded edges, have somewhat uneven thicknesses, etc. due to device fabrication conditions. The straight lines and right angles are used solely for convenience of representation of layers and features.

In the following description, semiconductor devices/dies/packages, methods for manufacturing the same, and the likes are set forth as preferred examples. It will be apparent to those skilled in the art that modifications, including additions and/or substitutions may be made without departing from the scope and spirit of the present disclosure. Specific details may be omitted so as not to obscure the present disclosure; however, the disclosure is written to enable one skilled in the art to practice the teachings herein without undue experimentation.

In the present disclosure, a doping region can have a conductive type expressed as a doping type. For example, a doping type maybe n-type or p-type. The term "n-type" may include a plus/minus sign. For example, with respect to n-type dopant, there are three conductive types, including "n+" "n−", and "n". An n+ doping region has a doping concentration higher/heavier than an n-doping region; and an n-doping region has a doping concentration than higher an n−-doping region. Doping regions of the same symbol may have different absolute doping concentrations. For example, two different n doping regions may have the same or different absolute doping concentrations. The definition can be applied to the p-type doping.

In some embodiments, the n-type dopant can include, but are not limited to, silicon (Si), carbon (C), germanium (Ge), Selenium (Se), tellurium (Te), or the like. In some embodiments, the p-type dopant can include, but are not limited to, magnesium (Mg), beryllium (Be), zinc (Zn), or the like. In the exemplary illustrations of the present disclosure, although the element is illustrated as a single layer, it can include multiple layers therein.

FIG. 1 is a vertical cross-sectional view of a semiconductor device 1A according to some embodiments of the present disclosure. The semiconductor device 1A includes a substrate 10, nitride-based semiconductor layers 12, 13, 14, 16, and 18, source electrodes 20 and 22, a passivation layer 30, a gate insulator layer 40, a gate electrode 42, and a drain electrode 44A.

The substrate 10 may be a semiconductor substrate. The exemplary materials of the substrate 10 can include, for example but are not limited to, Si, SiGe, SiC, gallium arsenide, p-doped Si, n-doped Si, sapphire, semiconductor on insulator, such as silicon on insulator (SOI), or other suitable substrate materials. In some embodiments, the substrate 10 can include, for example, but is not limited to, group III elements, group IV elements, group V elements, or combinations thereof (e.g., III-V compounds). In other embodiments, the substrate 10 can include, for example but is not limited to, one or more other features, such as a doped region, a buried layer, an epitaxial (epi) layer, or combinations thereof. In some embodiments, the material of the substrate 10 can include a silicon substrate with a <111> orientation.

The nitride-based semiconductor layer 12 is disposed on the substrate 10. The nitride-based semiconductor layer 12 can be doped to have n conductivity type. The exemplary materials of the nitride-based semiconductor layer 12 can include, for example but are not limited to, nitrides or group III-V compounds, such as GaN, AlN, InN, $In_xAl_yGa_{(1-x-y)}N$ where x+y≤1, $Al_yGa_{(1-y)}N$ where y≤1. For example, the nitride-based semiconductor layer 12 can be a n-type GaN layer.

The nitride-based semiconductor layer 13 is disposed on the nitride-based semiconductor layer 12. The nitride-based semiconductor layer 13 can serve as a buffer layer. The nitride-based semiconductor layer 13 can be in contact with the nitride-based semiconductor layer 12. The nitride-based semiconductor layer 13 can be configured to reduce lattice and thermal mismatches between the nitride-based semiconductor layers 12 and 14, thereby curing defects due to the mismatches/difference. The nitride-based semiconductor layer 13 may include a III-V compound. The III-V compound can include, for example but are not limited to, aluminum, gallium, indium, nitrogen, or combinations thereof. Accordingly, the exemplary materials of the nitride-based semiconductor layer 13 can further include, for example but not limited to, GaN, AlN, AlGaN, InAlGaN, or combinations thereof.

The nitride-based semiconductor layer 14 is disposed on/over the nitride-based semiconductor layer 13. The nitride-based semiconductor layer 14 can include two doped barrier regions 142 to define an aperture 144 therebetween. The aperture 144 can serve as a drift region in the nitride-based semiconductor layer 14. The aperture 144 can allow current to vertically flow through the nitride-based semiconductor layer 14. For example, at least one current can flow from a top to a bottom of the nitride-based semiconductor layer 14 through the aperture 144.

In the nitride-based semiconductor layer 14, the aperture 144 can have a conductivity higher than those of the doped barrier regions 142. To achieve it, in some embodiments, the doped barrier regions 142 can have p conductivity type. In some embodiments, p-dopants can be introduced into the doped barrier regions 142. In some embodiments, silicon ions can be introduced into the aperture 144 to improve the conductivity of the aperture 144. The nitride-based semiconductor layer 14 can be referred to as a current blocking layer.

The exemplary materials of the nitride-based semiconductor layer 14 can include, for example but are not limited to, nitrides or group III-V compounds, such as GaN, AlN, InN, $In_xAl_yGa_{(1-x-y)}N$ where x+y≤1, $Al_yGa_{(1-y)}N$ where y≤1. For example, the nitride-based semiconductor layer 14 may be a GaN layer, and the doped barrier regions 142 are formed from P-GaN.

The nitride-based semiconductor layer 16 can be disposed on/over/above the nitride-based semiconductor layer 14. The nitride-based semiconductor layer 16 can make contact with the nitride-based semiconductor layer 14. The top border of the aperture 142 is in contact with the nitride-based semiconductor layer 16. The nitride-based semiconductor layer 18 can be disposed on/over/above the nitride-based semiconductor layer 16.

The exemplary materials of the nitride-based semiconductor layer 16 can include, for example but are not limited to, nitrides or group III-V compounds, such as GaN, AlN, InN, $In_xAl_yGa_{(1-x-y)}N$ where x+y≤1, $Al_yGa_{(1-y)}N$ where y≤1. The exemplary materials of the nitride-based semiconductor layer 18 can include, for example but are not limited to, nitrides or group III-V compounds, such as GaN, AlN, InN, $In_xAl_yGa_{(1-x-y)}N$ where x+y≤1, $Al_yGa_{(1-y)}N$ where y≤1.

The exemplary materials of the nitride-based semiconductor layers 16 and 18 are selected such that the nitride-based semiconductor layer 18 has a bandgap (i.e., forbidden band width) greater/higher than a bandgap of the nitride-based semiconductor layer 16, which causes electron affinities thereof different from each other and forms a heterojunction therebetween. For example, when the nitride-based semiconductor layer 16 is an undoped GaN layer having a bandgap of approximately 3.4 eV, the nitride-based semiconductor layer 18 can be selected as an AlGaN layer having bandgap of approximately 4.0 eV. As such, the nitride-based semiconductor layers 16 and 18 can serve as a channel layer and a barrier layer, respectively. A triangular well potential is generated at a bonded interface between the channel and barrier layers, so that electrons accumulate in the triangular well, thereby generating a two-dimensional electron gas (2DEG) region adjacent to the heterojunction. Accordingly, the semiconductor device 1A is available to include at least one GaN-based high-electron-mobility transistor (HEMT).

In the present disclosure, the thicknesses of the nitride-based semiconductor layers 16 and 18 are selected as well, such that the 2DEG density of the 2DEG region can be easily affected by an external factor. The formation of the 2DEG region results from polarization effect of the nitride-based semiconductor layers 16 and 18, so the thicknesses of the nitride-based semiconductor layers 16 and 18 determine the extent of polarization effect therein. In some embodiments, the nitride-based semiconductor layer 18 is a thin barrier layer having a thickness in a range from about 2 nm to about 4 nm. As such, the polarization effect can be brought to a state that can depend on an external factor.

In some embodiments, an external factor may include an applied stress to the nitride-based semiconductor layer 18, such that the polarization effect is enhanced and that the 2DEG region is sufficient to let carriers flow therethrough. In some embodiments, an external factor may include a work function of a layer formed over the nitride-based semiconductor layer 16, which can elevate the conduct band energy of the nitride-based semiconductor layers 16 and 18. The elevation to the conduct band energy of nitride-based semiconductor layers 16 and 18 is advantageous to suppression to the 2DEG density of the 2DEG region.

The source electrodes 20 and 22 are disposed on/over/above the nitride-based semiconductor layer 14. The source electrodes 20 and 22 can make contact with doped barrier regions 142 of the nitride-based semiconductor layer 14. The nitride-based semiconductor layers 16 and 18 are located between the source electrodes 20 and 22. The source electrodes 20 and 22 can abut against sidewalls of the nitride-based semiconductor layers 16 and 18. The source electrodes 20 and 22 can abut against the heterojunction between the nitride-based semiconductor layers 16 and 18. The source electrodes 20 and 22 can electrically couple with the 2DEG region adjacent to the heterojunction.

In some embodiments, the source electrodes 20 and 22 can include, for example but are not limited to, metals, alloys, doped semiconductor materials (such as doped crystalline silicon), compounds such as silicides and nitrides, other conductor materials, or combinations thereof. The exemplary materials of the source electrodes 20 and 22 can include, for example but are not limited to, Ti, AlSi, TiN, or combinations thereof. The source electrodes 20 and 22 may be a single layer, or plural layers of the same or different composition. In some embodiments, the source electrodes 20 and 22 form ohmic contacts with the nitride-based semiconductor layer 16. The ohmic contacts can be achieved by applying Ti, Al, or other suitable materials to the source electrodes 20 and 22. In some embodiments, each of the source electrodes 20 and 22 is formed by at least one conformal layer and a conductive filling. The conformal layer can wrap the conductive filling. The exemplary materials of the conformal layer, for example but are not limited to, Ti, Ta, TiN, Al, Au, AlSi, Ni, Pt, or combinations thereof. The exemplary materials of the conductive filling can include, for example but are not limited to, AlSi, AlCu, or combinations thereof.

The passivation layer 30 is disposed over the nitride-based semiconductor layers 16 and 18. A vertical projection of the passivation layer 30 on the nitride-based semiconductor layer 14 is spaced apart from the aperture 144. The vertical projection of the passivation layer 30 on the nitride-based semiconductor layer 14 overlaps with the doped barrier regions 144.

More specifically, the passivation layer 30 has two portions 302 and 304 separated from each other. The portions 302 and 304 of the passivation layer 30 are respectively located directly above the doped barrier regions 142. A distance from the portion 302 to the portion 304 of the passivation layer 30 is greater than a width of the aperture 144. A width of each of the portions 302 and 304 of the passivation layer 30 is less than a width of each of the doped barrier regions 142. Therefore, an entirety of a vertical projection of each of the portions 302 and 304 of the passivation layer 30 on the nitride-based semiconductor layer 14 is within the doped barrier regions 142. That is, the vertical projection of the passivation layer 30 on the nitride-based semiconductor layer 14 is within the doped barrier regions 142. The source electrodes 20 and 22 abut against outer sidewalls of the portions 302 and 304 of the passivation layer 30.

The passivation layer 30 is positioned to modulate the 2DEG density of the 2DEG region. In this regard, the passivation layer 30 can provide stress to the nitride-based semiconductor layer 18. The stress can act as an external factor to the nitride-based semiconductor layer 18, which can enhance the 2DEG density of the 2DEG region. That is, the enhanced distribution of the 2DEG region is related to the passivation layer 30.

As the vertical projection of the passivation layer 30 on the nitride-based semiconductor layer 14 is spaced apart from the aperture 144, the 2DEG region immediately over the aperture 144 is free from enhancement provided by the passivation layer 30.

As the vertical projection of the passivation layer 30 on the nitride-based semiconductor layer 14 overlaps with the doped barrier regions 144, the 2DEG region immediately over the doped barrier regions 144 can have the enhanced 2DEG density. The source electrodes 20 and 22 can electrically couple with the enhanced 2DEG region. Such the configuration is advantageous to injection of carriers from the source electrodes 20 and 22 to the 2DEG region. Such the configuration is advantageous to extraction of carriers from the 2DEG region to the source electrodes 20 and 22.

In some embodiments, the passivation layer 30 can include, for example but are not limited to, nitride-based materials. The exemplary materials of the passivation layer 30 can include, for example but are not limited to, AlGaN, AlN, SiN, or combinations thereof.

Since the passivation layer 30 include the two portions 302 and 304 which are separated from each other, the nitride-based semiconductor layer 18 and the portions 302 and 304 of the passivation layer 30 can collectively form a trench 306 between the source electrodes 20 and 22. The trench 306 is located immediately over the aperture 144 of the nitride-based semiconductor layer 14. The trench 306 aligns with aperture 144 of the nitride-based semiconductor layer 14.

The gate insulator layer 40 is disposed over the nitride-based semiconductor layer 18. The gate insulator layer 40 is disposed over the portions 302 and 304 of the passivation layer 30. The gate insulator layer 40 is conformal with a profile constructed by the nitride-based semiconductor layer 18 and the passivation layer 30. The gate insulator layer 40 has a portion accommodated by the trench 306. The portion of the gate insulator layer 40 within the trench 306 is in contact with the nitride-based semiconductor layer 18. The opposite ends of the gate insulator layer 40 are located over the portions 302 and 304 of the passivation layer 30, respectively. The gate insulator layer 40 can extend from the source electrode 20 to the source electrode 22.

In some embodiments, the gate insulator layer 40 can include, for example but are not limited to, dielectric materials. The exemplary materials of the gate insulator layer 40 can include, for example but not limited to, $SiO_2$, SiN, $HfO_2$, or combinations thereof. In some embodiments, the passivation layer 30 and the gate insulator layer 40 can include materials than each other. In some embodiments, an interface between the passivation layer 30 and the gate insulator layer 40 is visible (e.g., being visible in SEM or TEM view) due to the material difference.

The gate electrode 42 is disposed over the nitride-based semiconductor layer 18 and the gate insulator layer 40. The gate electrode 42 is disposed between the portions 302 and 304 of the passivation layer 30. The gate electrode 42 is located within the trench 306. The gate electrode 42 is accommodated by the trench 306. The gate electrode 42 within the trench 306 is in contact with the gate insulator layer 40. The gate insulator layer 40 can wrap around sidewalls and a bottom surface of the gate electrode 42 within the trench 306.

The gate electrode 42 is located immediately over the aperture 144 of the nitride-based semiconductor layer 14. The gate electrode 42 aligns with aperture 144 of the nitride-based semiconductor layer 14. The gate electrode 42 is wider than the aperture 144 of the nitride-based semiconductor layer 14. Such the width difference is advantageous to the operation for switching on/off the semiconductor device 1A.

The gate electrode 42 in the trench 306 is separated from the passivation layer 30 by the gate insulator layer 40. The gate electrode 42 in the trench 306 is separated from the nitride-based semiconductor layer 18 by the gate insulator layer 40. The gate electrode 42 can form a metal-insulator-semiconductor (MIS) structure in combination with the nitride-based semiconductor layer 18 and the gate insulator layer 40.

The exemplary materials of the gate electrode 42 may include metals or metal compounds. The gate electrode 42 may be formed as a single layer, or plural layers of the same or different compositions. The exemplary materials of the metals or metal compounds can include, for example but are not limited to, W, Au, Pd, Ti, Ta, Co, Ni, Pt, Mo, TiN, TaN, metal alloys or compounds thereof, or other metallic compounds.

In response to the work function of the selected materials of the gate electrode 42, the gate electrode 42 can elevate the conduct band energy of the doped nitride-based semiconductor layers 16 and 18, so as to suppress the 2DEG density at a corresponding zone. Since the gate electrode 42 aligning with the aperture 144 is wider than the aperture 144 of the nitride-based semiconductor layer 14, a zone of the 2DEG region that is wider than the aperture 144 can get depleted. That is, the gate electrode 42 wider than the aperture 144 is used to make sure that the semiconductor device 1A can be fully turned off when the given gate bias is at approximately zero bias or below over a threshold voltage.

As such, the semiconductor device 1A can have an enhancement mode, which is in a normally-off state when the gate electrode 42 is at approximately zero bias or below over a threshold voltage. As a voltage applied to the gate electrode 42 is below a threshold voltage, the semiconductor device 1A is in a reverse operation, and carriers will hardly flow between the gate electrode 42 and the source electrode 20 or 22. Accordingly, carriers will hardly flow through the aperture 144 as well so it is at a switch-off state. In the reverse operation, the doped barrier regions 142 and the nitride-based semiconductor layer 13 can formed a reverse PN junction, so as to realize high breakdown voltage.

In the exemplary illustration of FIG. 1A, the normally-off state can be achieved by a manner free from a recessing process, so the nitride-based semiconductor layers 16 and 18 can horizontally expand in the structure. Herein, the phrase "a layer horizontally expanding in the structure" means each of the nitride-based semiconductor layers 16 and 18 is free from a recess structure.

In this regard, to achieve normally-off state, practically, other manners for forming a feature cutting a 2DEG region off may be used. One way to achieve a feature cutting a 2DEG region off is to form a recess structure to make a 2DEG region discontinuous by a recessing process. With respect to the recessing process, there is a need to perform a destructive step, such as an etching step. However, the etching step may result in surface states, so it will reduce the performance of the semiconductor device. Also, the process variation in the etching step may cause the lower yield rate. Similarly, such the manner of the present disclosure is free from an implantation process performed for cutting a 2DEG region off.

The drain electrode 44A is disposed on the substrate 10 and the nitride-based semiconductor layer 12. The drain electrode 44A is connected to the nitride-based semiconductor layer 12. The drain electrode 44A can make contact with the nitride-based semiconductor layer 12. The materials of the drain electrode 44A can be identical with or similar with those of the source electrodes 20 and 22.

Figure 1B:
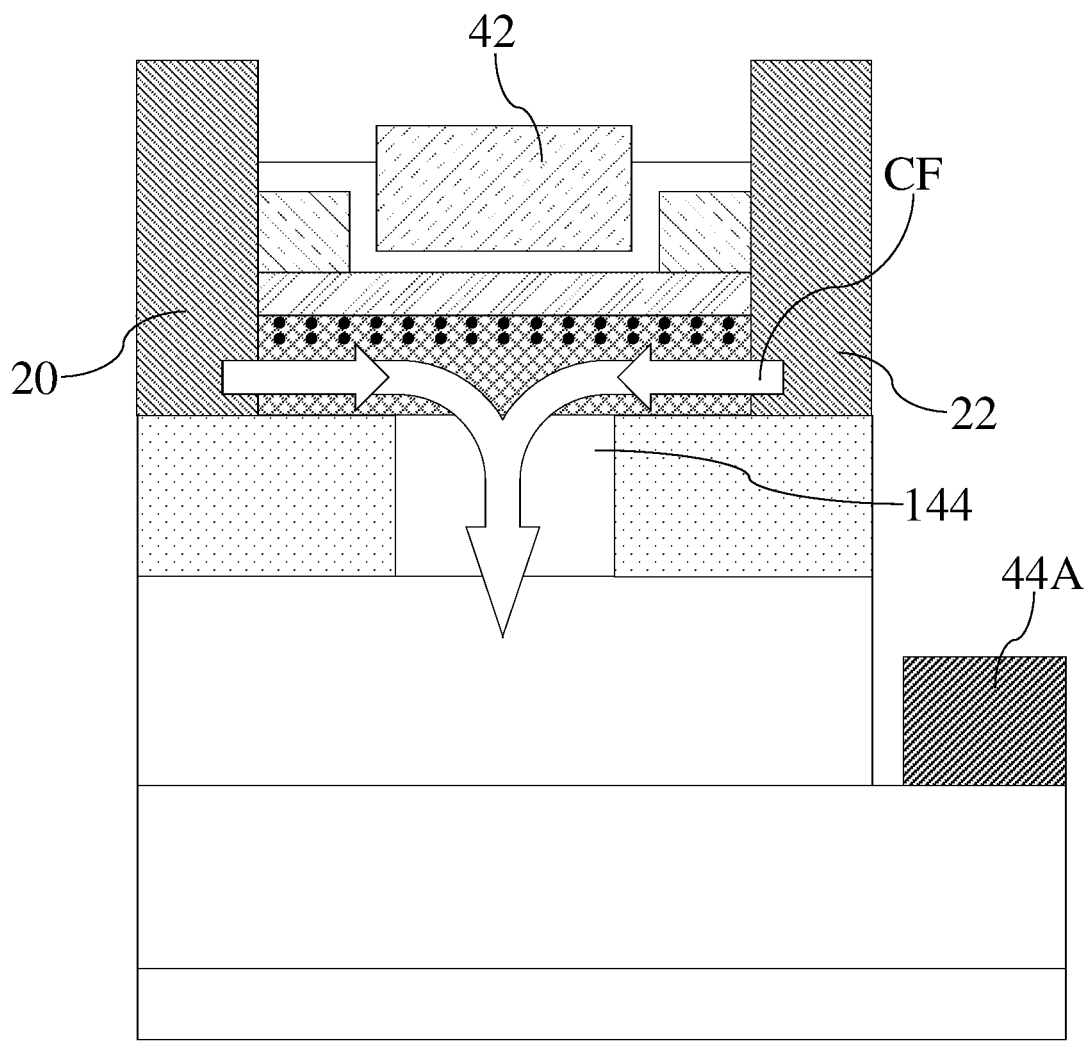
FIG. 1B depicts the semiconductor device of FIG. 1A operated at a turned-on state according to some embodiments of the present disclosure.

FIG. 1B depicts the semiconductor device 1A of FIG. 1A operated at a switch-on state according to some embodiments of the present disclosure. As a voltage applied to the gate electrode 42 is over a threshold voltage, a zone of the 2DEG region directly beneath the gate electrode 42 (i.e., being between the gate electrode 42 and the aperture 144) can get recovery so a carrier path from the source electrodes 20 and 22 to the aperture 144 is turned on. As such, at least one carrier flow CF can flow from the source electrodes 20 and 22 to the aperture 144. The carrier flow CF then can go through the aperture 144 and flow to reach the drain electrode 44A. Briefly, with such the configuration, the state of the semiconductor device 1A can be switched between normally on and normally off, which is determined according to the applied voltage.

Different stages of a method for manufacturing the semiconductor device 1A are shown in FIG. 2A, FIG. 2B, FIG. 2C, FIG. 2D, and FIG. 2E as described below. In the following, deposition techniques can include, for example but are not limited to, atomic layer deposition (ALD), physical vapor deposition (PVD), chemical vapor deposition (CVD), metal organic CVD (MOCVD), plasma enhanced CVD (PECVD), low-pressure CVD (LPCVD), plasma-assisted vapor deposition, epitaxial growth, or other suitable processes.

Figure 2A:
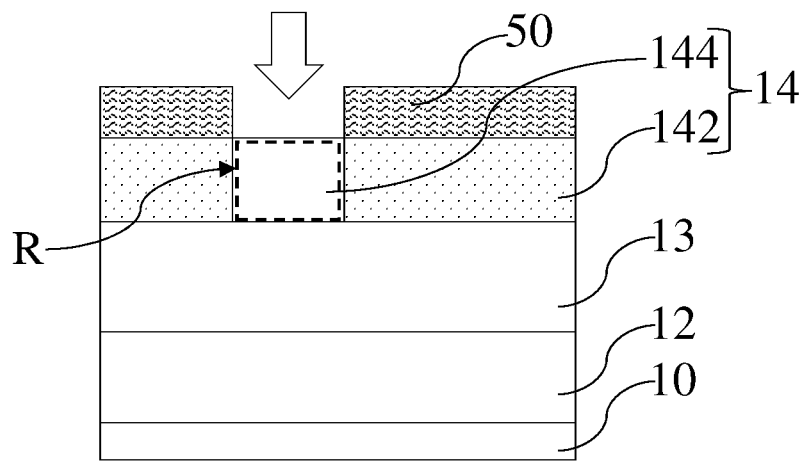
FIG. 2A, FIG. 2B, FIG. 2C, FIG. 2D, and FIG. 2E show different stages of a method for manufacturing a semiconductor device according to some embodiments of the present disclosure.

Referring to FIG. 2A, a substrate 10 is provided. Nitride-based semiconductor layers 12 and 13 can be formed over the substrate 10 in sequence by using deposition techniques. A nitride-based semiconductor layer 14 is formed over the nitride-based semiconductor layer 13 by using deposition techniques. A mask layer 50 is formed over the nitride-based semiconductor layer 14. The mask layer 50 has an opening to expose a portion of the nitride-based semiconductor layer 14. The nitride-based semiconductor layer 14 has the doped barrier regions 142. A region R between the doped barrier regions 142 of the nitride-based semiconductor layer 14 is exposed from the mask layer 50. An implantation process can be performed on the region R of the nitride-based semiconductor layer 14, so as to improve the conductivity of the region R of the nitride-based semiconductor layer 14. After the implantation process, the region R of the nitride-based semiconductor layer 14 has the conductivity improved so as to form an aperture 144 in the nitride-based semiconductor layer 14.

Figure 2B:
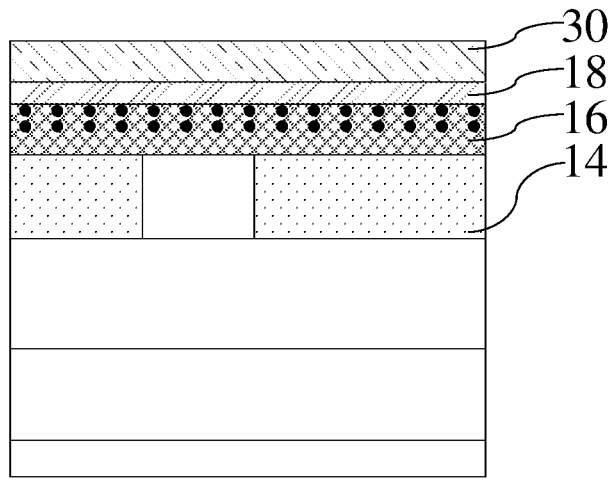

Referring to FIG. 2B, the mask layer 50 is removed, and nitride-based semiconductor layers 16 and 18 can be formed over the nitride-based semiconductor layer 14. The nitride-based semiconductor layers 16 and 18 can form a heterojunction therebetween. A 2DEG region can be formed adjacent to the heterojunction. A passivation layer 30 is formed on the nitride-based semiconductor layer 18. The blanket passivation layer 30 can provide stress to the nitride-based semiconductor layer 18 so the 2DEG density of the 2DEG region can be enhanced.

Figure 2C:
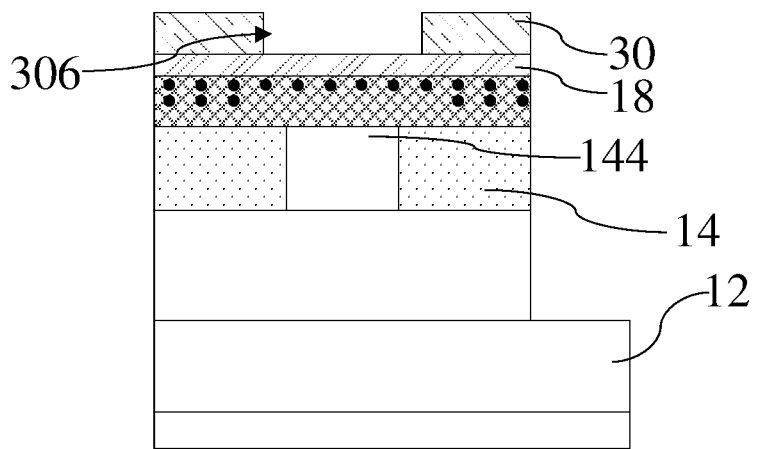

Referring to FIG. 2C, the passivation layer 30 is patterned to expose a portion of the nitride-based semiconductor layer 18, in which such the portion of the nitride-based semiconductor layer 18 aligns with the aperture 144 of the nitride-based semiconductor layer 14. The patterning the passivation layer 30 is performed such that the middle of the passivation layer 30 is removed. After the removal of middle of the passivation layer 30 is removed, the stress applied to the central region of the nitride-based semiconductor layer 18 is gone, and thus the 2DEG density of the 2DEG region at the corresponding region is reduced. As a result, with respect to the 2DEG region, the 2DEG density at non-central region is enhanced, and the 2DEG density at the central region is free from enhancement. Furthermore, the structure is processed such that the top surface of the nitride-based semiconductor layer 12 exposed. An electrode/a layer can be formed on the exposed top surface of the nitride-based semiconductor layer 12.

The patterning to patterning the passivation layer 30 can define the profile of the patterning the passivation layer 30. In some embodiments, a patterning process to the passivation layer 30 is performed such that a vertical projection of the passivation layer 30 on the nitride-based semiconductor layer 14 is spaced apart from the aperture 144 in the nitride-based semiconductor layer 14. In some embodiments, a patterning process to the passivation layer 30 is performed such that the exposed portion of the nitride-based semiconductor layer 18 has a width greater than the aperture 144 in the nitride-based semiconductor layer 14. In some embodiments, a patterning process to the passivation layer 30 is performed such that the nitride-based semiconductor layer 18 and the passivation layer 30 can collectively form a trench 306 directly above the aperture 144 in the nitride-based semiconductor layer 14.

Figure 2D:
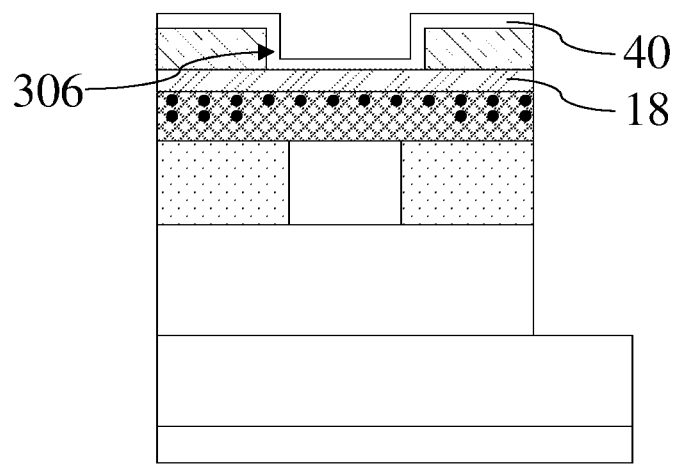

Referring to FIG. 2D, a gate insulator layer 40 is formed within the trench 306. The gate insulator layer 40 can be formed to make contact with the nitride-based semiconductor layer 18.

Figure 2E:
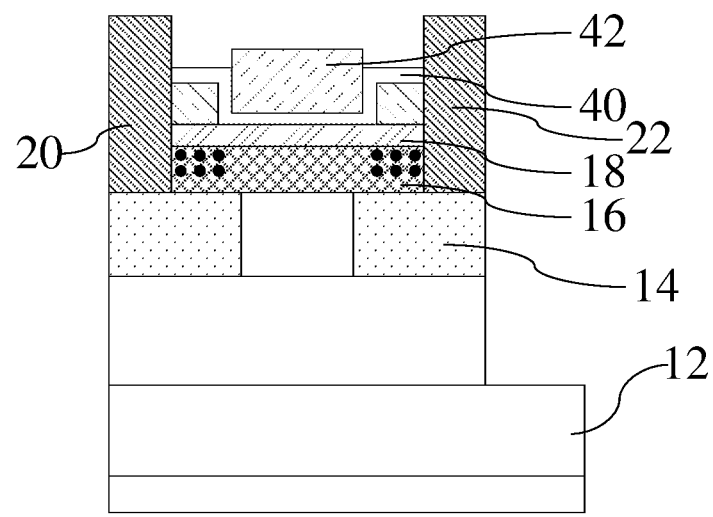

Referring to FIG. 2E, a gate electrode 42 is formed on the gate insulator layer 40. The material of the gate electrode 42 is selected such that the gate electrode 42 can elevate the conduct band energy of the nitride-based semiconductor layers 16 and 18, and thus the 2DEG region has a zone beneath the gate electrode 42 with its 2DEG density suppressed. Thereafter, source electrodes 20 and 22 can be formed to make contact with the nitride-based semiconductor layer 14. After a drain electrode formed to connect the nitride-based semiconductor layer 12, the structure of FIG. 1A can be obtained.

Figure 3:
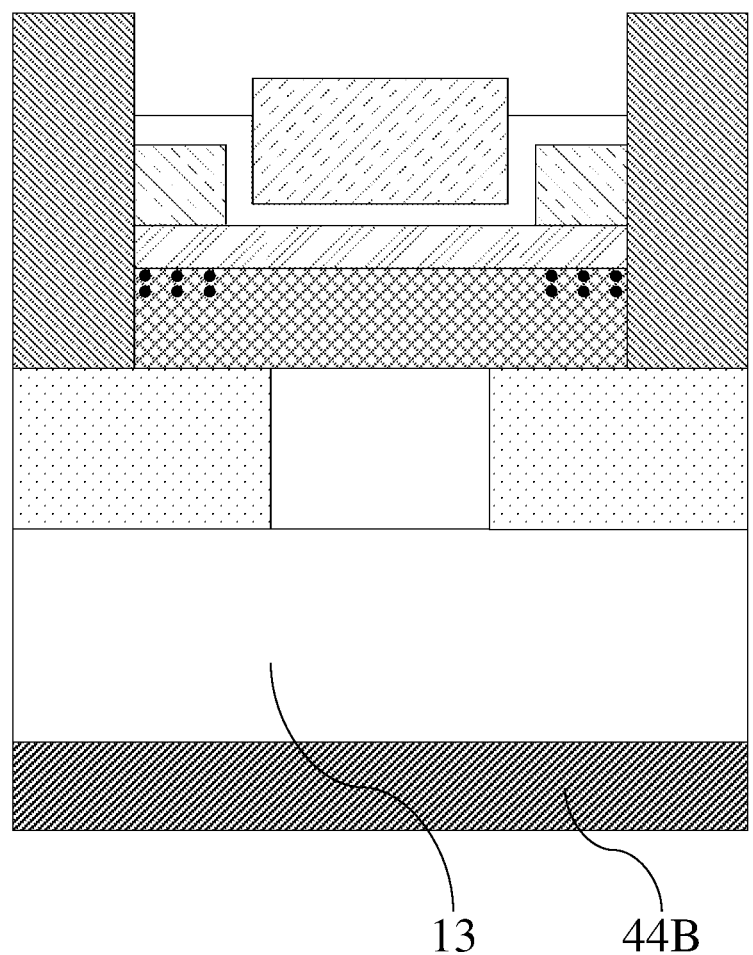
FIG. 3 is a vertical cross-sectional view of a semiconductor device according to some embodiments of the present disclosure.

FIG. 3 is a vertical cross-sectional view of a semiconductor device 1B according to some embodiments of the present disclosure. The semiconductor device 1B is similar to the semiconductor device 1A as described and illustrated with reference to FIG. 1A, except that the drain electrode 44A is replaced by a drain electrode 44B.

In the present embodiment, the substrate 10 and the nitride-based semiconductor layer 12 can be omitted. The drain electrode 44A is directly connected to the nitride-based semiconductor layer 13. The structure of the semiconductor device 1B can be achieved by using a temporary substrate. The temporary substrate can hold the structure of the semiconductor device 1B. During the holding, the substrate 10 and the nitride-based semiconductor layer 12 can be can be removed from the structure, and then the drain electrode 44B can be formed.

The embodiments were chosen and described in order to best explain the principles of the disclosure and its practical application, thereby enabling others skilled in the art to understand the disclosure for various embodiments and with various modifications that are suited to the particular use contemplated.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to 0.1%, or less than or equal to 0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. Further, it is understood that actual devices and layers may deviate from the rectangular layer depictions of the FIGS. and may include angles surfaces or edges, rounded corners, etc. due to manufacturing processes such as conformal deposition, etching, etc. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

The invention claimed is:

1. A nitride-based semiconductor device, comprising:
   a first nitride-based semiconductor layer comprising at least two doped barrier regions defining an aperture between the doped barrier regions;
   a second nitride-based semiconductor layer disposed over first nitride-based semiconductor layer;
   a third nitride-based semiconductor layer disposed on the second nitride-based semiconductor layer and having a bandgap higher than a bandgap of the second nitride-based semiconductor layer;
   a passivation layer disposed over the third nitride-based semiconductor layer, wherein a vertical projection of the passivation layer on the first nitride-based semiconductor layer is spaced apart from the aperture;
   a gate insulator layer disposed over the third nitride-based semiconductor layer; and
   a gate electrode disposed over the gate insulator layer and aligning with the aperture;
   wherein the gate electrode and the aperture are vertically separated by the second nitride-based semiconductor layer, the third nitride-based semiconductor layer and the gate insulator layer;
   wherein the passivation layer is in physical contact with the third nitride-based semiconductor layer, and the passivation layer and the at least two doped barrier regions are vertically separated by the second nitride-based semiconductor layer and the third nitride-based semiconductor layer;
   wherein the aperture has a conductivity higher than a conductivity of the at least two doped barrier regions.

2. The nitride-based semiconductor device of claim 1, wherein the gate electrode is wider than the aperture.

3. The nitride-based semiconductor device of claim 1, wherein the third nitride-based semiconductor layer and the passivation layer collectively form a trench accommodating the gate insulator layer and the gate electrode.

4. The nitride-based semiconductor device of claim 3, wherein the gate insulator layer wraps around sidewalls and a bottom surface of the gate electrode in the trench.

5. The nitride-based semiconductor device of claim 3, wherein the gate electrode in the trench is separated from the third nitride-based semiconductor layer and the passivation layer by the gate insulator layer.

6. The nitride-based semiconductor device of claim 1, wherein the vertical projection of the passivation layer on the first nitride-based semiconductor layer overlaps with the doped barrier regions.

7. The nitride-based semiconductor device of claim 6, wherein an entirety of the vertical projection of the passivation layer on the first nitride-based semiconductor layer is within the doped barrier regions.

8. The nitride-based semiconductor device of claim 1, further comprising:
   a source electrode disposed over the first nitride-based semiconductor layer and abutting against sidewalls of the second and third nitride-based semiconductor layers and the passivation layer.

9. The nitride-based semiconductor device of claim 1, wherein the passivation layer has a first portion and a second portion respectively located directly above the doped barrier regions, and the gate electrode is located between the first and second portions of the passivation layer.

10. The nitride-based semiconductor device of claim 9, wherein a distance from the first portion to the second portion of the passivation layer is greater than a width of the aperture.

11. The nitride-based semiconductor device of claim 1, wherein the third nitride-based semiconductor layer has a thickness in a range from about 2 nm to about 4 nm.

12. The nitride-based semiconductor device of claim 1, wherein the third nitride-based semiconductor layer comprises AlGaN, InAlN, AlN, or combinations thereof.

13. The nitride-based semiconductor device of claim 1, wherein the passivation layer comprises AlGaN, AlN, Si, or combinations thereof.

14. The nitride-based semiconductor device of claim 1, wherein the gate insulator layer comprises $SiO_2$, SIN, $HfO_2$, or combinations thereof.

15. The nitride-based semiconductor device of claim 1, wherein the passivation layer and the gate insulator layer comprise different materials than each other.

16. A method for manufacturing a nitride-based semiconductor device, comprising:
   forming a second nitride-based semiconductor layer over a first nitride-based semiconductor layer;
   forming a third nitride-based semiconductor layer over the second nitride-based semiconductor layer to form a heterojunction therebetween;
   forming a passivation layer on the third nitride-based semiconductor layer;
   patterning the passivation layer to expose a portion of the third nitride-based semiconductor layer which aligns with an aperture of the first nitride-based semiconductor layer;
   forming a gate insulator layer on the exposed portion of the third nitride-based semiconductor layer; and
   forming a gate electrode on the gate insulator layer;
   wherein the gate electrode and the aperture are vertically separated by the second nitride-based semiconductor layer, the third nitride-based semiconductor layer and the gate insulator layer;
   wherein the first nitride-based semiconductor layer comprises at least two doped barrier regions defining the aperture between the doped barrier regions, and the aperture has a conductivity higher than a conductivity of the at least two doped barrier regions;
   wherein the passivation layer is in physical contact with the third nitride-based semiconductor layer, and the passivation layer and the at least two doped barrier regions are vertically separated by the second nitride-based semiconductor layer and the third nitride-based semiconductor layer.

17. The method of claim 16, wherein the patterning the passivation layer is performed such that a vertical projection of the passivation layer on the first nitride-based semiconductor layer is spaced apart from the aperture in the first nitride-based semiconductor layer.

18. The method of claim 16, wherein the patterning the passivation layer is performed such that the third nitride-based semiconductor layer and the passivation layer collectively form a trench directly above the aperture in the first nitride-based semiconductor layer.

19. The method of claim 16, wherein the patterning the passivation layer is performed such that the exposed portion of the third nitride-based semiconductor layer has a width greater than the aperture in the first nitride-based semiconductor layer.

20. The method of claim 16, wherein the third nitride-based semiconductor layer has a thickness in a range from about 2 nm to about 4 nm.

* * * * *